US012620997B2

(12) United States Patent
Wang et al.

(10) Patent No.: US 12,620,997 B2
(45) Date of Patent: May 5, 2026

(54) HIGH SPEED MONOBIT ANALOG-DIGITAL CONVERTER SYSTEM WITH INTEGRATED PROGRAMMABLE FRONT-END

(71) Applicant: BAE SYSTEMS Information and Electronic Systems Integration Inc., Nashua, NH (US)

(72) Inventors: Renyuan Wang, Windham, NH (US); Cameron Huang, Manchester, NH (US); Steven E. Turner, Nashua, NH (US); Jeffrey F. Bonner-Stewart, Newton, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 149 days.

(21) Appl. No.: 18/641,908

(22) Filed: Apr. 22, 2024

(65) Prior Publication Data

US 2025/0330191 A1     Oct. 23, 2025

(51) Int. Cl.
*H03M 1/12*        (2006.01)
*H03M 1/08*        (2006.01)

(52) U.S. Cl.
CPC ........... *H03M 1/1245* (2013.01); *H03M 1/08* (2013.01)

(58) Field of Classification Search
CPC .............................. H03M 1/1245; H03M 1/08
USPC ................................. 341/155, 120, 118, 126
See application file for complete search history.

(56) References Cited

U.S. PATENT DOCUMENTS

2015/0160065 A1 *   6/2015  Sai ........................ G01F 23/284
                                                            342/21

OTHER PUBLICATIONS

Pok et al. EEEon Microwaves vol. 45, N) 12, Dec. 1997.*

* cited by examiner

*Primary Examiner* — Peguy Jean Pierre
(74) *Attorney, Agent, or Firm* — Maine Cernota & Curran; Gary McFaline

(57) ABSTRACT

A monobit analog-digital converter (ADC) system and method are disclosed, the system comprising a front-end signal conditioning system equipped with a programmable attenuator and amplifier for processing analog signals, where the attenuator, which may include a cascade of programmable attenuator cells, is controlled by an attenuation control signal to adjust signal attenuation to cause a signal-to-noise ratio (SNR) in the negative domain, after which an amplifier amplifies the attenuated signal with the suitable SNR, where the amplified signal is then converted to a monobit signal by a monobit ADC, thereby achieving an ADC system that enables conditioning and digitizing of RF signals over a wide range of input signal powers with control over the output spectrum signal power and harmonics to achieve low-power real-time general-purpose broadband blocker detection for adaptive radios and for interference detection, main beam radar signal detection, and instantaneous frequency measurement, among other fields requiring general-purpose blocker identification with low size, weight, power, and cost (SWaP-C).

15 Claims, 8 Drawing Sheets

510 520 530

Gain_dB + NF_dB

Atten_dB

Gain_dB

Analog Input

Monobit Output

ADC

200: Programmable Attenuator

300: Programmable Amplifier

400: Monobit Analog-Digital Converter

100: Programmable Frontend Signal Conditioning System (Frontend)

300: Programmable Amplifier

HIGH SPEED MONOBIT ANALOG-DIGITAL CONVERTER SYSTEM WITH INTEGRATED PROGRAMMABLE FRONT-END

STATEMENT OF GOVERNMENT INTEREST

This invention was made with government support under Contract No. FA8650-21-C-7001 awarded by DARPA MTO. The United States Government has certain rights in this invention.

FIELD OF THE DISCLOSURE

The following disclosure relates generally to interference (i.e., blocker) identification, and, more specifically, to utilizing high speed monobit analog-to-digital converters (ADCs) with integrated programmable front ends for low-power, low system overhead broadband applications.

BACKGROUND

Adaptive radios, used in various applications, now extend beyond the $K_u$ band (12-18 GHZ). In congested electromagnetic environments, blockers (jammers) can saturate receivers and impair system functionality. Broadband real-time interference detection is crucial for achieving blocker rejection, requiring knowledge of frequencies, power levels, bandwidths, and possibly waveforms. Efficient detection with low latency and minimal system impact in terms of size, power, cost, and complexity is desired. Use of the main receiver for interference detection diverts resources, so alternative methods like dispersive frequency-to-time mapping detection and other auxiliary receivers have been proposed; however these approaches have limitations in terms of instantaneous bandwidth, frequency resolution, latency, dynamic range and SWaP (size, weight, and power). Monobit ADCs offer simplicity and lower power consumption, but face dynamic range limitations. A solution is sought for wideband, general-purpose blocker identification with low size, weight, power, and cost (SWaP-C).

SUMMARY

The present disclosure teaches a high-speed monobit ADC system with a programmable, on-chip RF front-end. Embodiments are capable of directly sampling from 2 GHz to 20 GHz for broadband, general purpose blocker detection.

One embodiment of the present invention provides an analog-digital converter system comprising: a front-end signal conditioning system comprising an attenuator configured to attenuate an analog signal and an amplifier in operative communication with the attenuator, the amplifier configured to amplify the analog signal after attenuation by the attenuator; and a monobit analog-digital converter in operative communication with the amplifier, the monobit analog-digital converter configured to convert the analog signal to a monobit signal, wherein the attenuation of the attenuator and the amplification of the amplifier are set so as to reduce the signal-to-noise ratio into the negative SNR domain, and so that the signal levels of the analog signal will be within the dynamic range of the monobit analog-digital converter.

Another embodiment of the present invention provides such an analog-digital converter system, wherein attenuation of the attenuator is programmable.

A further embodiment of the present invention provides such an analog-digital converter system, wherein the attenuator comprises a plurality of cascade-connected attenuator cells.

Yet another embodiment of the present invention provides such an analog-digital converter system, wherein the attenuator is configured to be programmable by bypassing individual attenuator cells in response to an attenuation control signal.

A yet further embodiment of the present invention provides such an analog-digital converter system, wherein gain of the amplifier is programmable.

Still another embodiment of the present invention provides such an analog-digital converter system, wherein the monobit analog-digital converter comprises: an interleaved sampler configured for interleaved sampling of the output of the monobit analog-digital converter to produce a plurality of data streams; and a demultiplexer configured to further separate the plurality of data streams into a greater plurality of data streams.

A still further embodiment of the present invention provides such an analog-digital converter system, further comprising a fast Fourier transformer in operative communication with the monobit analog-digital converter, wherein the fast Fourier transformer is configured to perform fast Fourier transformation on an output of the monobit analog-digital converter.

Even another embodiment of the present invention provides an analog-digital converting method, comprising: attenuating an input signal using an attenuator; using an amplifier to amplify the output signal from the attenuator; and using a monobit analog-digital convertor to perform monobit analog-digital conversion, wherein the attenuation of the attenuator and the amplification of the amplifier are set so as to reduce the signal-to-noise ratio into the negative SNR domain, and so that the signal levels of the analog signal will be within the dynamic range of the monobit analog-digital converter.

An even further embodiment of the present invention provides such a method, further comprising tuning the attenuator.

A still even another embodiment of the present invention provides such a method, wherein tuning of the attenuator is achieved by bypassing an attenuator cell in an attenuator that comprises a plurality of attenuator cells.

A still even further embodiment of the present invention provides such a method, further comprising tuning the amplifier.

Still yet another embodiment of the present invention provides such a method, further comprising sampling a plurality of monobit analog-digital convertor outputs and demultiplexing the sampled results.

A still yet further embodiment of the present invention provides such a method, further comprising performing digital post-processing on an output of the monobit analog-digital convertor.

Even yet another embodiment of the present invention provides such a method, wherein the digital post-processing on an output of the monobit analog-digital convertor is performance of a fast Fourier transform.

Even yet further embodiment of the present invention provides such a method, wherein a result of the digital post-processing is used to adjust the attenuation of the attenuator and/or adjust the amplification of the amplifier.

Still even yet another embodiment of the present invention provides such a method, wherein a result of the digital post-processing is used to adjust attenuation of a band-stop filter that is configured to attenuate a frequency band of the input signal.

A still even yet further embodiment of the present invention provides a receiver comprising: an analog-digital converter system that comprises a front-end signal conditioning system comprising an attenuator configured to attenuate an analog signal and an amplifier in operative communication with the attenuator, the amplifier configured to amplify the analog signal after attenuation by the attenuator; and a monobit analog-digital converter in operative communication with the amplifier, the monobit analog-digital converter configured to convert the analog signal to a monobit signal; wherein the attenuation of the attenuator and the amplification of the amplifier are set so as to reduce the signal-to-noise ratio into the negative SNR domain, and so that the signal levels of the analog signal will be within the dynamic range of the monobit analog-digital converter.

Yet still even another embodiment of the present invention provides such a receiver, further comprising: post-processing circuitry configured to perform digital post-processing on said monobit signal.

A yet still even further embodiment of the present invention provides such a receiver, further comprising: a band-stop filter to attenuate one or more blocking frequency identified through said digital post-processing.

A yet still even further still embodiment of the present invention provides such receiver, wherein the attenuation of the attenuator is programmable.

Details of implementations are set forth in the accompanying drawings and the description below. Other features will be apparent from the description and drawings, and from the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

This disclosure teaches a high-speed, monobit ADC system with a programmable, on-chip RF front-end signal conditioning system (front-end) 100 that is capable of directly sampling from 2 GHz or below to 20 GHz and can be used in broadband general-purpose interference (blocker) detection. Embodiments of the single-bit 40 GSPs (Giga Sample Per second) ADC system are implemented in the GlobalFoundries (GF) RF 45 nm silicon-on-insulator (45RFSOI) process, but there is no limitation thereto insofar as the technology used enables RF transistors and gate lengths that are adequately short to achieve 20 GHz operation. Such embodiments provide a high-bandwidth, time-interleaved, monobit ADC system with a programmable RF front-end.

ADCs are conventionally operated in the positive input-referred signal-to-noise-ratio (SNR) regime. As monobit ADCs sample with only a single bit of resolution, the resulting signal-to-noise-and-distortion ratio (SNDR) is limited to about 6 dB in such a regime, where the nonlinear distortion generated by the highly nonlinear, single-bit sampling function dominates. However, operating in the negative input SNR regime (that is, a regime wherein the input noise is dominant over the input signal, such that the signal-to-noise ratio is less than 1 and the logarithm of the signal-to-noise ratio is negative) reduces spurious content in the output spectrum and improves dynamic range to meet requirements for interference detection. Intuitively, the process is similar to that of noise dithering to reduce spurious quantization noise. To that end, embodiments of the monobit ADC system described herein are designed such that the monobit ADC will operate in the negative input SNR regime.

Furthermore, as the levels of direct noise injection needed at the input are not easily implemented on-chip with low power and small footprint, the approach introduced in embodiments is to utilize programmable wideband attenuation as a passive alternative to external noise injection, enabling operation of monobit sampling in the negative input SNR regime without requiring the power that is necessary for external noise injection. In addition, programmable RF signal conditioning used in embodiments provides control and flexibility over the input SNR and output spectrum after digitization, enabling application of optimal operating conditions for the monobit ADC. Since the monobit ADC captures only a single bit of resolution, it provides a low-power and low-complexity solution, beneficial for low SWAP-C.

Figure 1:
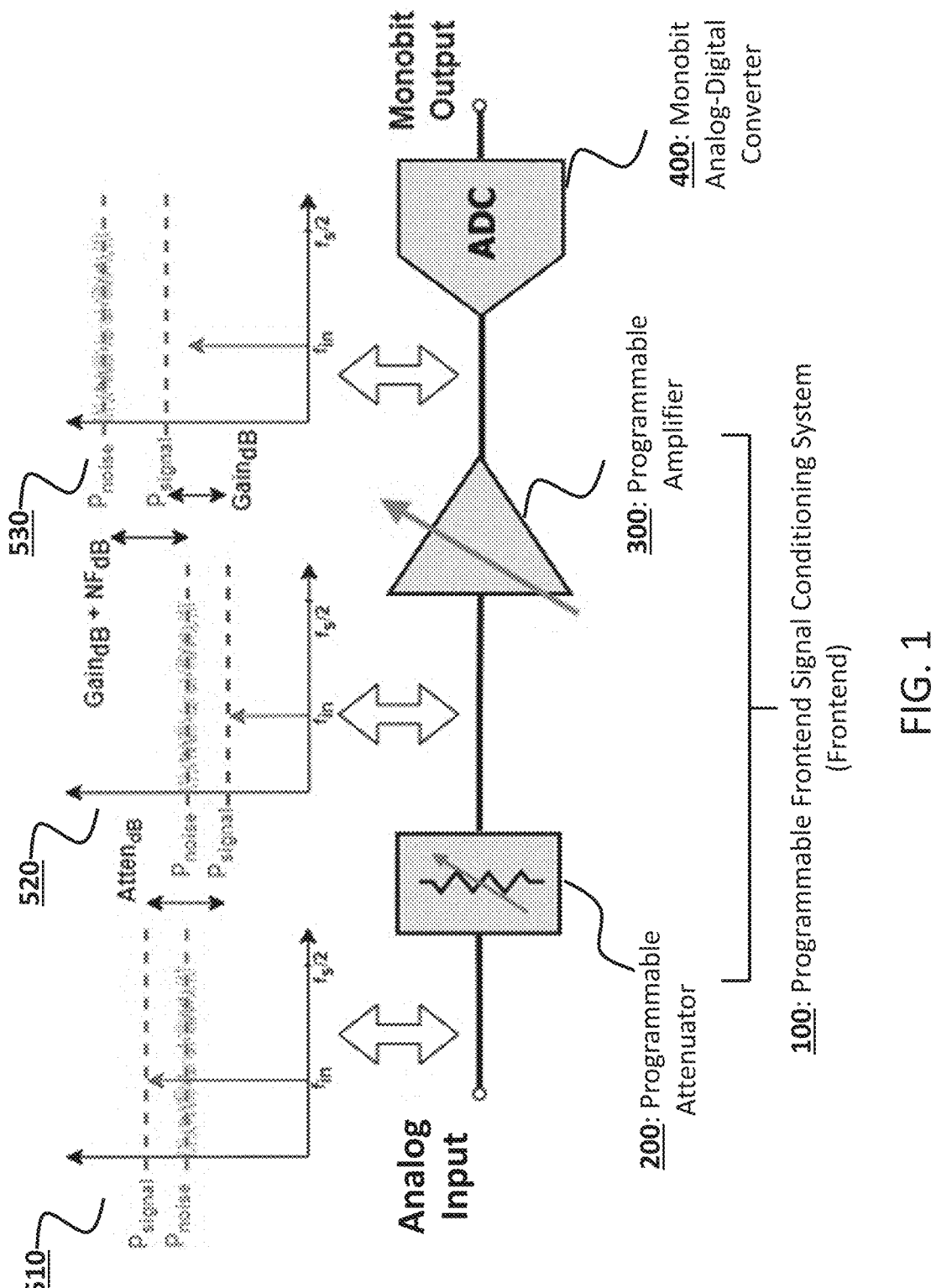
FIG. 1 is a functional diagram of a front-end signal conditioning system with signal and noise powers through a cascade to an ADC input, in accordance with embodiments of the present disclosure.

More specifically, as depicted in FIG. 1, embodiments of the present disclosure, given a Radio Frequency (RF) analog input signal with the signal-to-noise profile indicated by 510, use a programmable front-end signal conditioning system (front-end) 100 that uses an on-chip, programmable attenuator 200 to first attenuate the input signal towards a noise floor, as shown by the signal-to-noise profile indicated by 520, and then uses a programmable amplifier, comprising a wideband gain block, described below, to amplify the signal, along with the noise power generated by internal circuits, to provide a desired signal-to-noise profile (signal-to-noise ratio), indicated by 530, at the input of a monobit analog-digital converter (ADC) 400. The noise figure (NF) of the full RF cascade, noted in 530, is determined by the first attenuator and successive buffers, described below, where the NF characterizes the final signal and noise levels at the input to the monobit ADC 400. This wideband attenuation approach, as opposed to, for example, direct noise injection, can be implemented with low complexity and low power in scaled RF technologies. Power-efficient wideband gain and attenuation is designed with digital programmability to provide tuning flexibility in the front-end interface.

Figure 2:
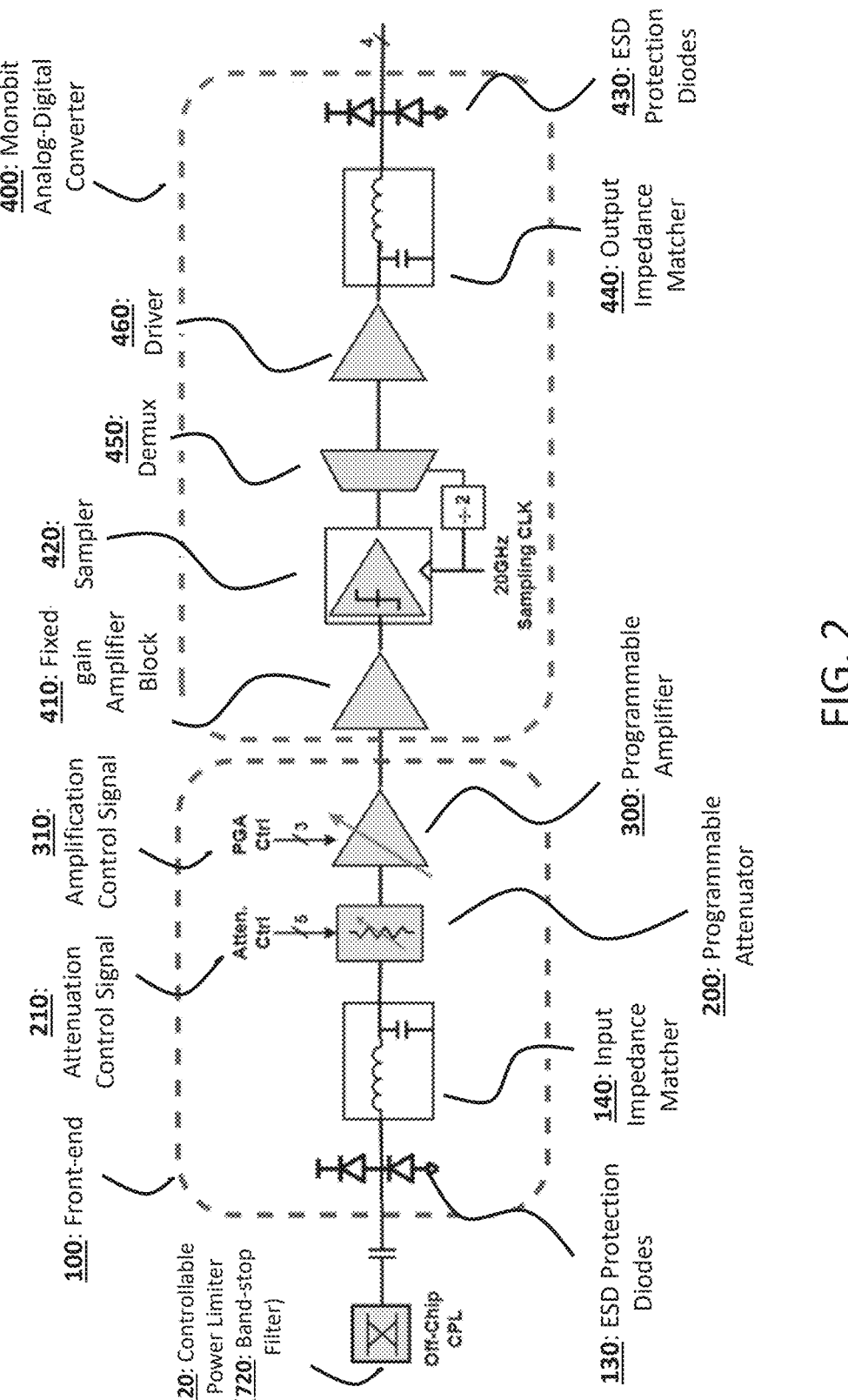
FIG. 2 is a block diagram depicting elements in a monobit ADC system chip, in accordance with embodiments of the present disclosure.

FIG. 2 provides a block diagram of one embodiment of a monobit ADC system chip architecture. As depicted in FIG. 2, an RF signal from an antenna 710, passes through an off-chip controllable power limiter (CPL) 120, into the programmable RF front-end 100. In embodiments, the front-end 100 comprises diodes 130 for electrostatic discharge protection, an input impedance matcher 140, a programmable attenuator 200, and a programmable amplifier 300. The programmable amplifier 300 may be configured so that, under 3 bits of digital control of an amplification control signal 310 from the outside, for example, the signal level is raised to a level that, after amplification by a fixed-gain amplifier block 410, described below, can be sensed by a sampler 420, described below, in the monobit analog-digital converter 400. The RF front-end 100 circuitry on this chip is designed to have, for example, attenuation over 5 bits of digital control of an attenuation control signal 210. This programmable attenuation tunes the SNR through the range of the programmable attenuator 200, allowing SNR programmability for a signal coupled from the antenna path. A programmable amplifier 300 finally provides 3 bits of an amplification control signal 310 to correct for gain variation through the cascade and to set the final signal and noise power levels at the input of the monobit analog-digital converter 400.

In embodiments, fixed-gain amplifier blocks 410 further amplify the signal in the early stage of the monobit analog-digital converter 400 after the front-end cascade. In the monobit analog-digital converter 400, the output of the fixed-gain amplifier block is inputted into a sampler 420 that has, for example, a threshold value of 0.5V to output a "1" monobit value if the input value is greater than 0.5 V and a "0" if the monobit value if the input value is less than 0.5V. This sampler 420 will be described in greater detail using FIG. 3, below. As will be described below, in embodiments the sampler outputs two 20 GHz data streams, which are inputted into a demultiplexer (demux) 450 to convert the data streams into four 10 GS/s data streams, thereby reducing the bit frequency to a level that is more convenient for subsequent processing. Following this, the data streams pass through an output driver 460 and an output impedance matcher 440, to be outputted to the subsequent processing, which in embodiments may be a digital signal processor, such as a fast Fourier transformer 600.

Embodiments of the monobit ADC system are intended to be implemented as part of an auxiliary receiver in parallel with a main receiver, not shown, and only tap off a small portion of the power available in the main receiver path. To maximize the ADC output dynamic range, embodiments utilize a monobit ADC 400 that is configured to operate with about −40 dBm input power, for example, accounting for losses through a coupler, not shown, connected to the main receiver path. Signal power at the input of the chip above −40 dBm would cause compression at the output of the RF front-end 100 after signal amplification, since the output compression point, as set by the final amplifier, is close to 0 dBm in an example embodiment.

If a higher input signal power is saturating the chain, a higher on-chip attenuation control setting may be used for the attenuation control signal 210 to maintain an output signal power below compression. However, this would decrease the usable tuning range of the attenuator and the possible range of input SNR values for the monobit ADC. Since the expected noise power at the input of the ADC is −10 dBm at the maximum gain setting for the programmable amplifier 300, signals close to the compression point at the output of the front-end would be operating in the positive SNR regime, away from the designed operation of the chip.

On the other hand, lower power input signals may run into the minimum sensitivity of the monobit ADC 400. That is, given lower signal power, the processed output fundamental may disappear into the noise floor, as set by the system sampling time. A programmable attenuator 200 and programmable amplifier 300 can condition the input signal power relative to the noise power to achieve the desired SNR given that the input signal interferer power is within the range between compression and minimum sensitivity.

Figure 3:
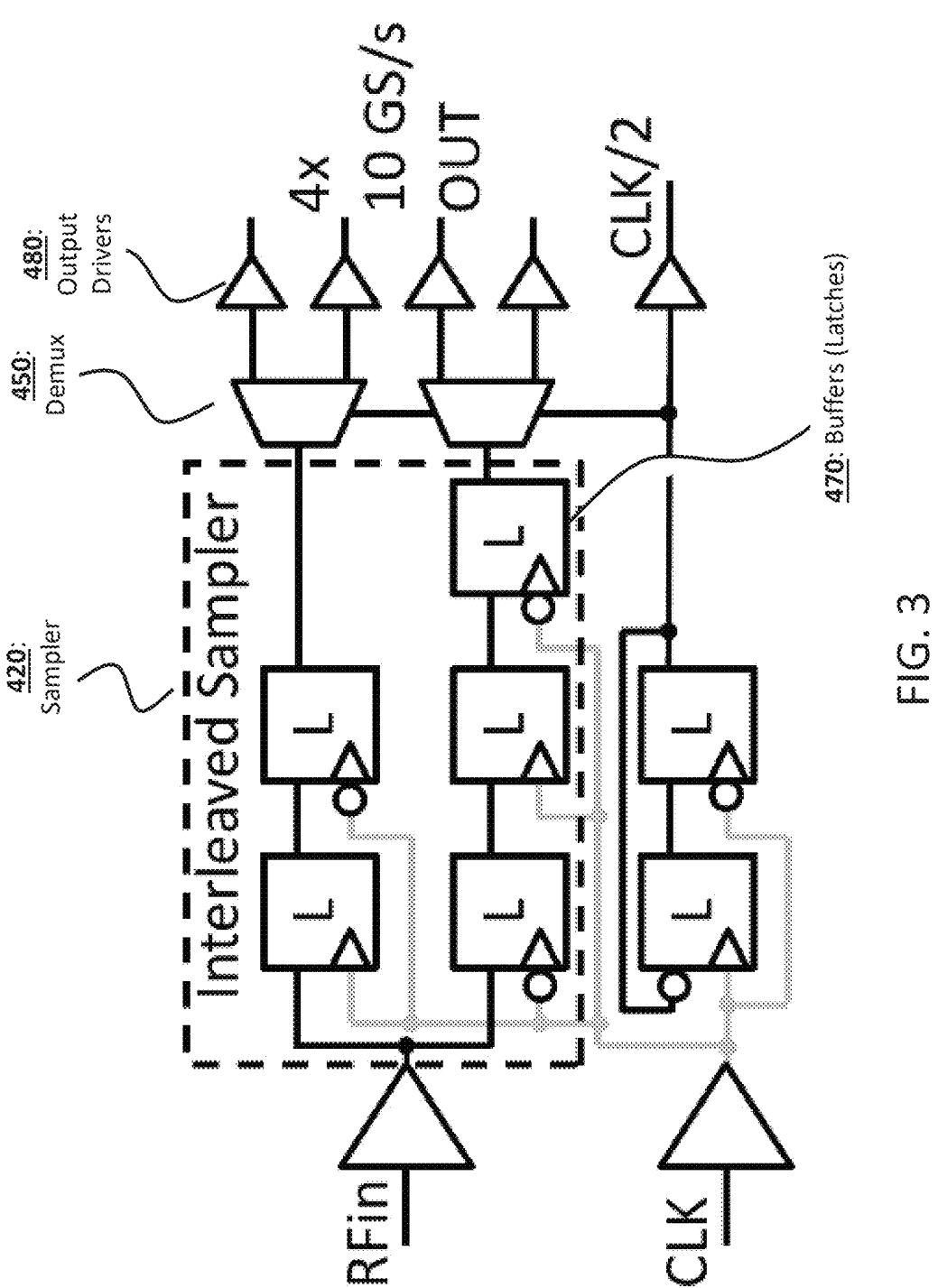
FIG. 3 is a block diagram depicting details of a sampler and demultiplexer module, in accordance with embodiments of the present disclosure.

Now referring to FIG. 3, which shows a block diagram describing a sampler 420 and demultiplexer 450 module in accordance with embodiments, the monobit ADC 400 uses a 20 GHz sampling clock provided externally to perform interleaved 40 GS/s sampling. A demultiplexer 450 stage following the initial sampler also provides four 10 GS/s output streams to successive fan-out of buffers (latches) 470 in an output distribution stage. Finally, output drivers 480 drive a 100Ω matched differential load, not shown, off-chip. The clock/2 reference clock is also driven off-chip by the output drivers 480 to be used for synchronization. The output drivers 480 provide the 10 GS/s streams to a fast Fourier (FF) transformer 600, not shown in FIG. 3, for time-frequency domain transformation, to provide data to downstream systems regarding frequency and magnitude of jamming signals. The FF transformer 600 may be provided on the same chip as the system described above, or may be provided off-chip. In embodiments the sampler 420, the demultiplexer 450, the output buffers 470, and the output drivers 480, and the like, may employ current-mode logic to facilitate high-speed processing. Conversely, they may employ voltage-mode logic to facilitate energy savings, depending on design constraints.

Figure 4:
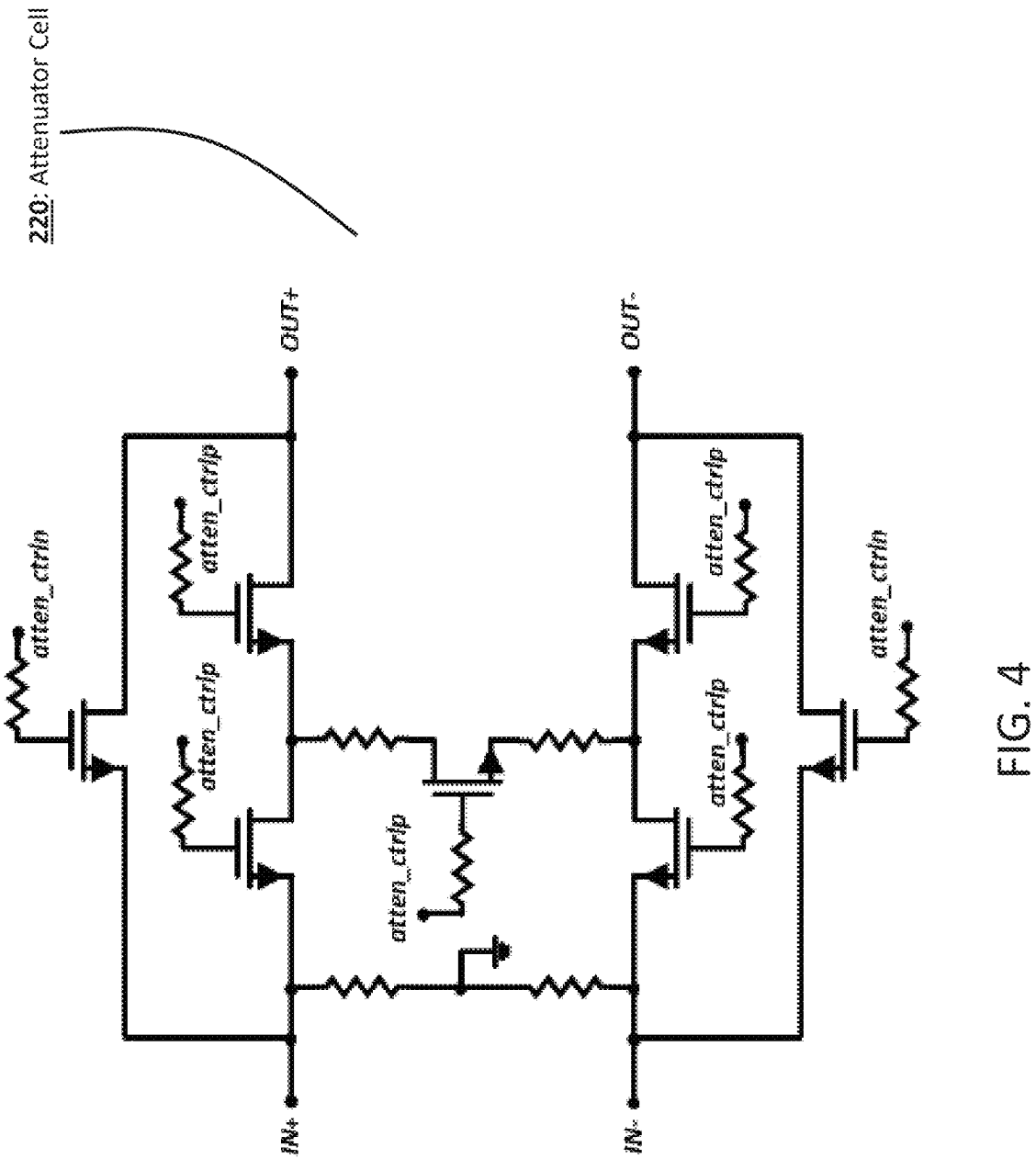
FIG. 4 is a schematic depicting a T-network attenuator cell of a programmable attenuator, in accordance with embodiments of the present disclosure.

As described above, in embodiments the RF front-end 100 may comprise a programmable attenuator 200, multiple cascaded fixed-gain amplifier blocks 410, not shown in FIG. 2, that also serve as buffers, and a programmable amplifier 300 for driving the input of the monobit analog-digital converter 400. The front-end programmable attenuator 200 may be 100Ω differential matched at the input and output with $S_{11} < −9.4$ dB, and may consist essentially of five scaled cascade-connected attenuator cells 220, which, in embodiments may be structured as depicted in FIG. 4, with 1.5 dB each of unit attenuation. The final attenuator cell 220 of a programmable attenuator 200 of an embodiment may be as shown in FIG. 4. Each attenuator cell 220 may consist of a T-type network with a bypass switch, not shown, where a digital control bit, not shown, selects between either an attenuating state or a bypass state. In an exemplary embodiment manufactured for test purposes, the attenuation of the programmable attenuator 200 was designed to be flat from DC to 20 GHz with 47.2 dB of maximum attenuation and 5.9 dB of minimum attenuation with all bypass switches, not shown, enabled. A maximum of 1.4 dB of attenuation variation was present across the 2 GHz to 20 GHz bandwidth in the bypass state. Since the attenuation variation across frequencies is less than one LSB (Least Significant Bit) of attenuation, further attenuation compensation across the frequency band was not necessary. The programmable attenuator 200 along with the first of the plurality of fixed-gain amplifier blocks (buffers) 410 controls the total NF for the cascade and can be programmed for the desired input SNR.

In embodiments, the fixed-gain amplifier blocks 410 are implemented as differential buffers with shunt-peaked loads for bandwidth extension. The total gain and power per fixed-gain amplifier block 410 may be chosen to achieve the total amount of cascade gain needed while maintaining >20 GHz of bandwidth. Sizes of single-ended kit inductors, not shown, may be chosen to push the self-resonant frequency of the inductor out of band. Input and output coplanar transmission lines, not shown, may be included as loading at the output to physically separate each fixed-gain amplifier block 410 for isolation. The peaking achieved by the fixed-gain amplifier blocks 410 around 20 GHz may be used to compensate frequency roll-off of other components.

The programmable amplifier 300 of embodiments may be implemented to overcome total gain variation from process variation through the cascade and also sets the correct signal levels at the input of the monobit ADC 400. The programmable amplifier 300 may set the overall cascade linearity, and the output compression point for the cascade may be about 0 dBm.

Figure 5:
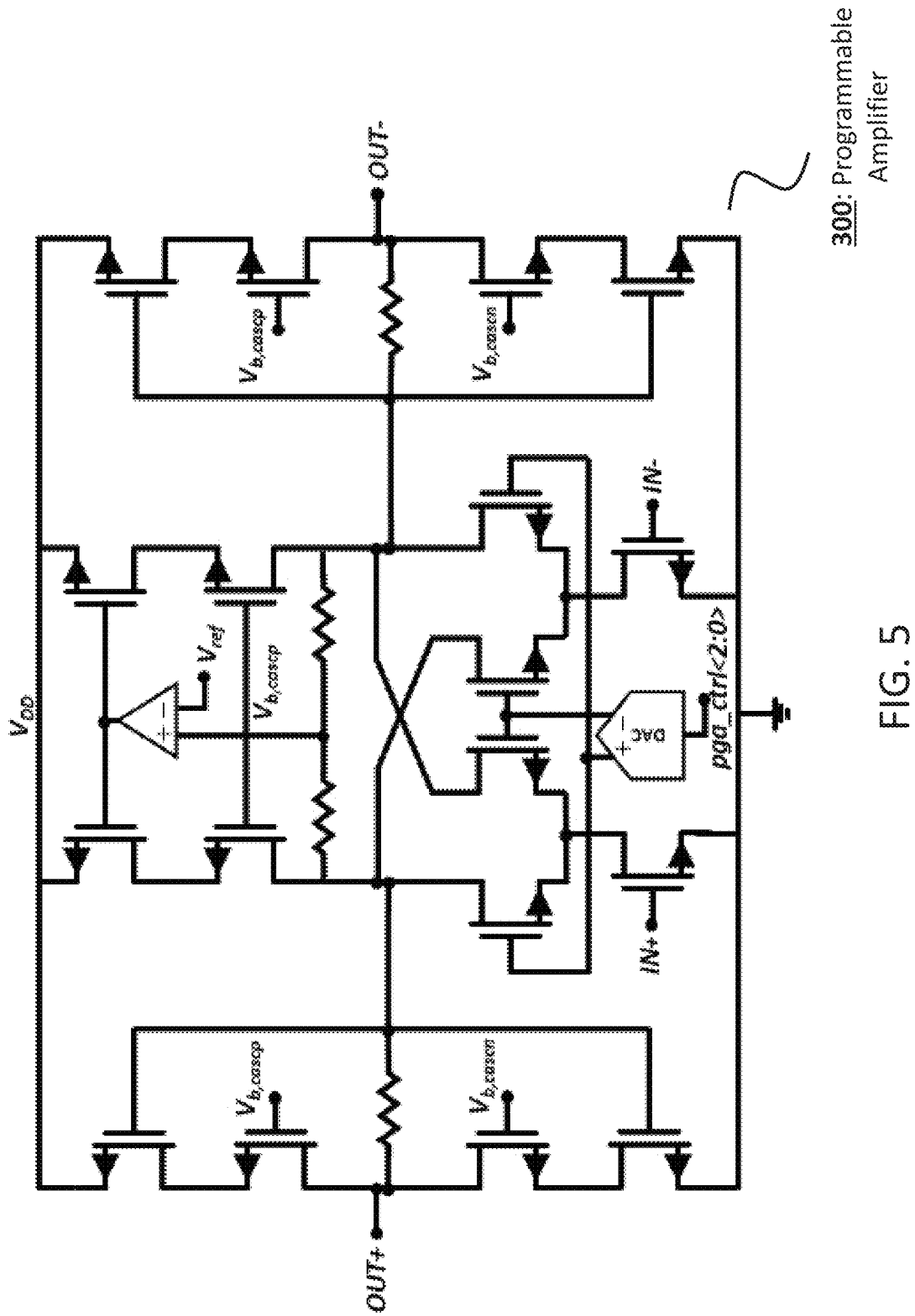
FIG. 5 is a schematic depicting a wideband programmable amplifier circuit, in accordance with embodiments of the present disclosure.

As shown in FIG. 5, in embodiments the programmable amplifier 300 may be designed as a transconductance (Gm) and transimpedance amplifier (TIA) pair to maximize bandwidth. The use of such a Gilbert quad cascode device for the programmable amplifier 300 provides gain tunability by steering the positive and negative phases of current from the pseudo-differential transconductor toward the transimpedance load. As can be appreciated from FIG. 5, the tuning voltage for the quad cascode device may come from a separate resistor digital-to-analog converter (RDAC) with, for example, three-bit digital control by the amplification control signal 310, and in embodiments the gain tuning range may be ~14.2 dB. While in a programmable amplifier 300 of such a design the current tuning has an exponential relationship with the tuning voltage, it would be within the skill of one of ordinary skill in the art to linearize the gain tuning as well. The inverter-type TIA of embodiments may use shunt-shunt feedback, where closed loop gain is set by the feedback resistor, which may be sized smaller to improve bandwidth. Cascode devices may be added to the transconductor current source of embodiments as well as in the TIA to improve output resistances and increase loop gain. Common-mode feedback may be added to the output of the Gm stage of embodiments along with the inherent TIA feedback to stabilize common-mode voltages and maintain overhead for devices. Mismatch in DC current between the N/P-type devices may be compensated in embodiments by the Gm current source, and DC voltage variations at the TIA output node may be minimized within headroom margins due to a smaller feedback resistor. Using two stages that are DC-coupled negates the need for a large, DC-blocking capacitor that would otherwise increase parasitics and area. In embodiments wherein there is a lower limit to the frequency of interest, a DC-blocking capacitor may be added to the input to contribute to a high-pass transfer function in the RF front-end 100. As a pseudo-differential inverter TIA topology is sensitive to supply variations, gain variation in the cascaded gain blocks could be stabilized further across PVT corners by stabilizing the Gm through the amplifier cascade.

The monobit analog-digital converter 400 of embodiments may include a two-way interleaved sampler as well as a 2:1 demultiplexer (demux), as depicted in FIG. 3, and may sample the RF input data stream with an external 20 GHz sampling clock, as depicted in FIG. 2, to provide four 10 GS/s output data streams. As mentioned above, the unit buffers (latches) 470 may be implemented as current-mode logic to maximize bandwidth, including a current-mode logic (CML) input buffer and latch 470, scaled between the interleaved sampler 420 and demultiplexer 450 stage to use the 20 GHz input clock and internally generated 10 GHz clock/2 respectively. Voltage swing through the CML logic to the output drivers 480 is designed to meet downstream digital input swing requirements.

In an exemplary embodiment designed as described above, when manufactured for testing purposes, the RF front-end 100 achieved a total power consumption of 60.8 mW while the monobit ADC 400 dissipated only 112.1 mW of power, providing a power-efficient solution to the interference detection problem. For further power reduction, in embodiments the demultiplexer 450 stage could be removed to reduce the number of output streams to two 20 GS/s streams, trading off power that is consumed by the monobit ADC 400 with a higher downstream processing frequency. In the exemplary embodiment, an additional 157.4 mW was dissipated in 1002 differential off-chip drivers that were included only to drive the nominal impedance of oscilloscopes used in the measurement setup. If downstream on-chip processing is available, these output drivers could be removed as the output buffers would drive on-chip digital gates instead.

The total size of the chip, in embodiments, may be 3 mm by 3 mm. In an exemplary embodiment that was manufactured for testing purposes, this size was chosen based on the minimum buy size for the wafer combined with practical manufacturing concerns regarding connectivity. In the test embodiment the monobit ADC 400 measured only 350 μm by 850 μm and the front-end 100 measured 900 μm by 300 μm, leaving room for sufficient supply decoupling capacitors, not shown, spread through the chip. 100Ω differential output drivers were provided for each of the output data streams as well as the clock/2 output, and drive transmission lines to the pads at the edge of the chip. Matching networks were designed and placed closed to the pads to match pad parasitics and the ribbon wire-bond inductance. ESD structures were placed close to the pads and were designed separately for RF and DC inputs/outputs to reduce loading. In other embodiments, other circuitry, such as digital signal processers, may be included on the chip as well, enabling reduced consumption of space and power.

In embodiments, the various components described above of the front-end 100 and the monobit ADC 400 may be incorporated into a single ADC system chip 750.

Figure 6:
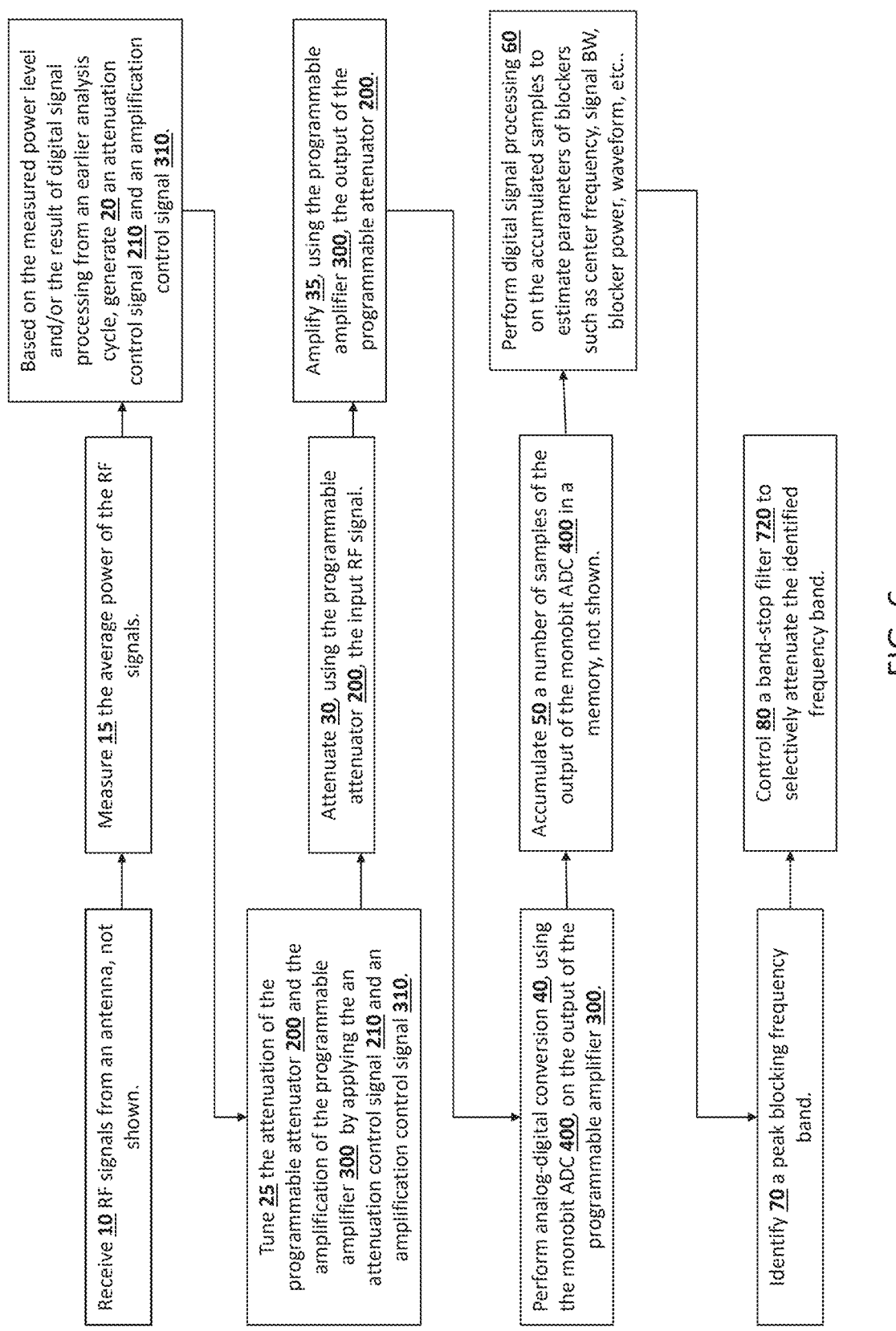
FIG. 6 is a schematic depicting an analog-digital converting method that uses passive noise injection through front-end analog signal processing prior to monobit analog-digital conversion.

Another aspect of the present disclosure is an analog-digital converting method that uses passive noise injection through front-end analog signal processing prior to monobit analog-digital conversion. For example, as depicted in FIG. 6, RF signals (analog signals) that include strong blockers may be received 10 from, for example, the antenna 710. The average power level of the RF signals may be measured 15 using, for example, a broadband RF power detector, not shown. Based on the measured power level and/or the result of digital signal processing from an earlier analysis cycle, an attenuation control signal 210 and an amplification control signal 310 may be generated 20. The generation of the attenuation control signal 210 and the amplification control signal 310 may be through, for example, establishing an empirically derived optimal SNR in the negative domain (i.e., one where the log of the SNR is negative) for the input of the monobit ADC, and, based on the noise figure of the signal chain prior to the sampler, calculating the amount of attenuation that must be applied to the measured RF signals to produce a signal with the optimal SNR for monobit analog-digital conversion by the monobit ADC 400 and calculating the amount of amplification that will then be necessary to amplify the signals to levels within the dynamic range at the input of the sampler 420.

The calculated attenuation control signal 210 and amplification control signal 310 may be applied to tune 25 the programmable attenuator 200 and programmable amplifier 300, respectively, to cause sequential attenuation 30 and amplification 35 of the inputted RF signal, to thereby condition the RF signal for optimal monobit analog-digital conversion. In embodiments, the application of the attenuation control signal 210 may achieve this tuning of the programmable attenuator 200 through bypassing one or more attenuator cells 220 that structure programmable attenuator 200. This conditioned RF signal is then applied to the monobit ADC 400 to perform analog-digital conversion 40 to produce monobit data, which, in the embodiment described above, may comprise, for example, four 10 GS/s data streams. In embodiments, this monobit analog-digital conversion 40 may be achieved through the use of an interleaved sampler 420, described above in reference to FIG. 3, followed by demultiplexing through demultiplexers 450, described above. These monobit data may be outputted through the output drivers 480, described above in refence to FIG. 3, to an external system, not shown. In embodiments, this external system may be on the same chip as the monobit ADC 400, or may be located externally. In embodiments, a predetermined number of samples of these outputted monobit data may be accumulated 50 in a memory of an external system, to be subjected to digital signal processing 60 by an external system. The digital signal processing 60 may be, for example, carrying out a fast Fourier transform on the accumulated data samples to determine peak signal frequencies and power levels thereof. The peak signal frequencies and power levels thereof may then be used by external systems in, for example, countermeasures for blocking, and may also be fed back for use in tuning the attenuation and amplification control signals 210 and 310, as described above.

As depicted in FIG. 2, in embodiments, the countermeasures for blocking may include identifying 70, through the digital signal processing 60, a peak blocking frequency band, followed by controlling 80 a band-stop filter 720 (which is either a plurality of selectable band-stop filters or a variable band stop filter) so as to selectively attenuate the identified frequency band. In embodiments, this process of identifying 70 the peak remaining blocking frequency band and selectively attenuating 80 the identified frequency band may be iterated to remove blocking frequency bands sequentially.

Figure 7:
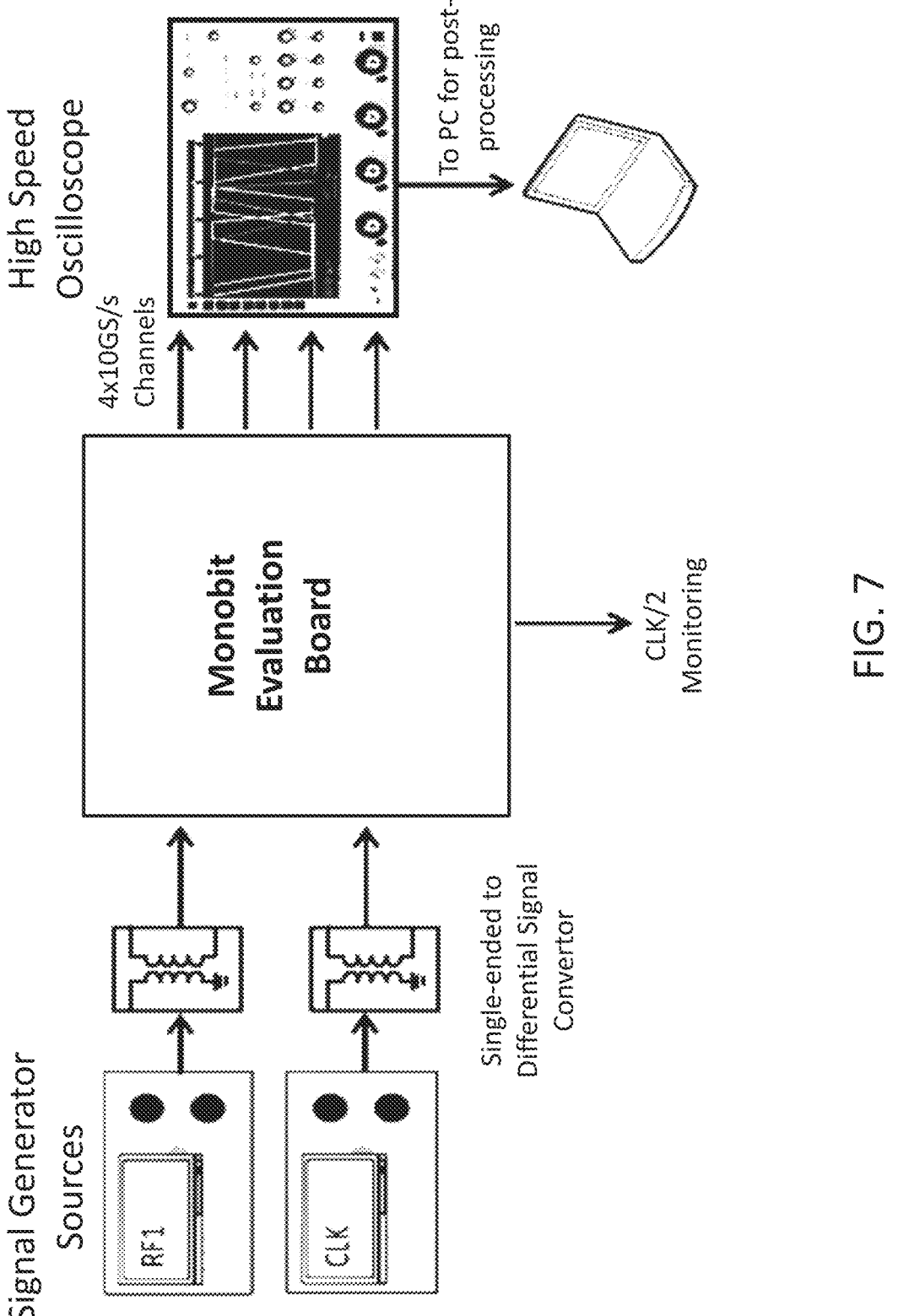
FIG. 7 is a schematic depicting a monobit evaluation board in a test setup, in accordance with embodiments of the present disclosure.

To test and validate an exemplary embodiment of a monobit ADC with an integrated programmable front-end, a monobit ADC chip comprising the components described above was constructed and used to transmit four 10 GS/s data streams to 100Ω differential loads, connected to a high-speed oscilloscope via an evaluation board, as depicted in FIG. 7. Data from the output streams was captured on separate channels and processed using Matlab to generate output spectra. The evaluation board included necessary bypass capacitors and physical switches for the attenuation control signal 210 and the amplification control signal 310.

The evaluation board featured length-matched traces for RF and clock signals, DIP switches for digital control bits, and DC-blocking capacitors near the connectors. The monobit chip interfaced with the board via ribbon wire-bonds to reduce input wire inductance. Signal generators provided up to 20 GHz signals for input and clock. Manual fine calibration was required for precise alignment.

The digital oscilloscope captured 262, 144 bits per 10 GS/s channel at 40 GS/s sampling. Post-processing in Matlab produced output spectra. Data was thresholded to a purely digital signal. Calibration settings remained constant for subsequent measurements. The sampled bit-stream was reconstructed, segmented, weighted, zero-padded, and processed with an FFT. Averaging FFTs smoothed noise in the spectrum plots.

The monobit ADC system was subjected to testing to measure the output spectrum while varying single-tone signal power and frequency at the chip input, as well as the attenuation control signal 210 and amplification control signal 310 to control the input SNR. Specific control bit settings conditioned the signal to achieve the desired SNR level at the input of the monobit ADC 400. The output spectra for different input signal frequencies and powers were analyzed. Spurious tones were observed, possibly due to time-interleaving mismatches or clock leakage, suggesting the need for mitigation techniques such as additional filtering or digital calibration. Output spectra were obtained for various input signal frequencies and powers, and settings for the attenuation control signal 210 and amplification control signal 310 were adjusted to target specific SNR levels at the input of the monobit ADC 400. The effect of increasing attenuation control values on harmonic powers relative to the fundamental was examined, and it was verified that third-order harmonics disappeared into the noise floor after the first attenuation step, while leaving a significant first-order signal.

Sweeping the attenuation control signal 210 for specific input tones provided insight into the processed output power for different attenuation control signal 210 settings, identifying relative attenuation control values for conditioning the RF input. Simultaneously sweeping the attenuation control signal 210 and the amplification control signal 310 effectively decreased the input SNR, resulting in decreased power of the third-order harmonic independent of signal power change. This additional noise power at the input to the monobit ADC 400 operated as noise dithering, resulting in a substantially enhanced ability to differentiate between first-order and third-order tones.

As mentioned in the monobit operation discussion, the noise floor of the output spectrum is related to the sampling time and can be chosen to target system latency specifications. Similarly, the frequency resolution also has a direct tradeoff with the number of samples used to process the digital spectrum. Thus, the high bit rate of the monobit ADC enables high sensitivity with a short sensing time. Of course, additional sensing time and power must be allocated towards the FFT (Fast Fourier Transform) of the output and processing of the spectrum, which takes place external to the monobit chip. Note that the effectiveness of the monobit ADC system does not rely on the properties of the incoming signal (e.g. sparsity and time-duration).

An exemplary embodiment that was constructed for testing purposes provided a wide-band 40 GS/s monobit ADC system with integrated programmable front-end, fabricated in the GF 45RFSOI process, enabling signal detection over the 2 GHz to 20 GHz bandwidth with at least 40 dB programmable attenuation range, achieving an SNDR of ~38.6 dB. The total power consumption of the RF front-end 100 and the monobit ADC 400 was 172.9 mW, with 60.8 mW for the RF front-end 100, and 112.1 mW for the monobit ADC 400, including samplers and clock distribution, providing a superior technology in terms of suitability for wideband general-purpose blocker identification with low size, weight, power, and cost (SWaP-C).

Additionally, on-chip digital post-processing may be added to the present device, greatly reducing power consumption by eliminating the 100Ω output drivers. In embodiments, circuitry 600 for carrying out FFT (post processing) of the output and processing of the spectrum is incorporated into the ADC system chip 750. Regardless of whether or not the fast Fourier transformer 600 is incorporated into the ADC system chip 750, the result of the FFT and/or processing of the spectrum may be used in tuning the monobit chip, such as, for example generating the attenuation control signal 210 and the amplification control signal 310 to adjust the attenuation of the programmable attenuator 200 and/or to adjust the amplification of the programmable amplifier 300, to thereby condition the RF signal for optimal monobit analog-digital conversion, setting the signal-to-noise ratio into the negative SNR domain, so that the signal levels of the analog signal will be within the dynamic range of the monobit analog-digital converter.

In the exemplary embodiment built for testing purposes, the full chip was 3 mm by 3 mm while the core circuitry was much smaller, leaving room for sufficient bypass and enough peripheral space for wire-bond connections to external systems, as well as structures to provide protection against ESD (Electrostatic Discharge).

In embodiments, the ADC system chip 750 may be designed to condition and digitize RF signals over a wide range of input signal powers with control over the output spectrum signal power and harmonics by tuning the SNR of the input into the monobit ADC 400. This provides a potential solution for achieving a low-power real-time general-purpose broadband blocker detection for adaptive radios and other applications such as battlefield communication.

Figure 8:
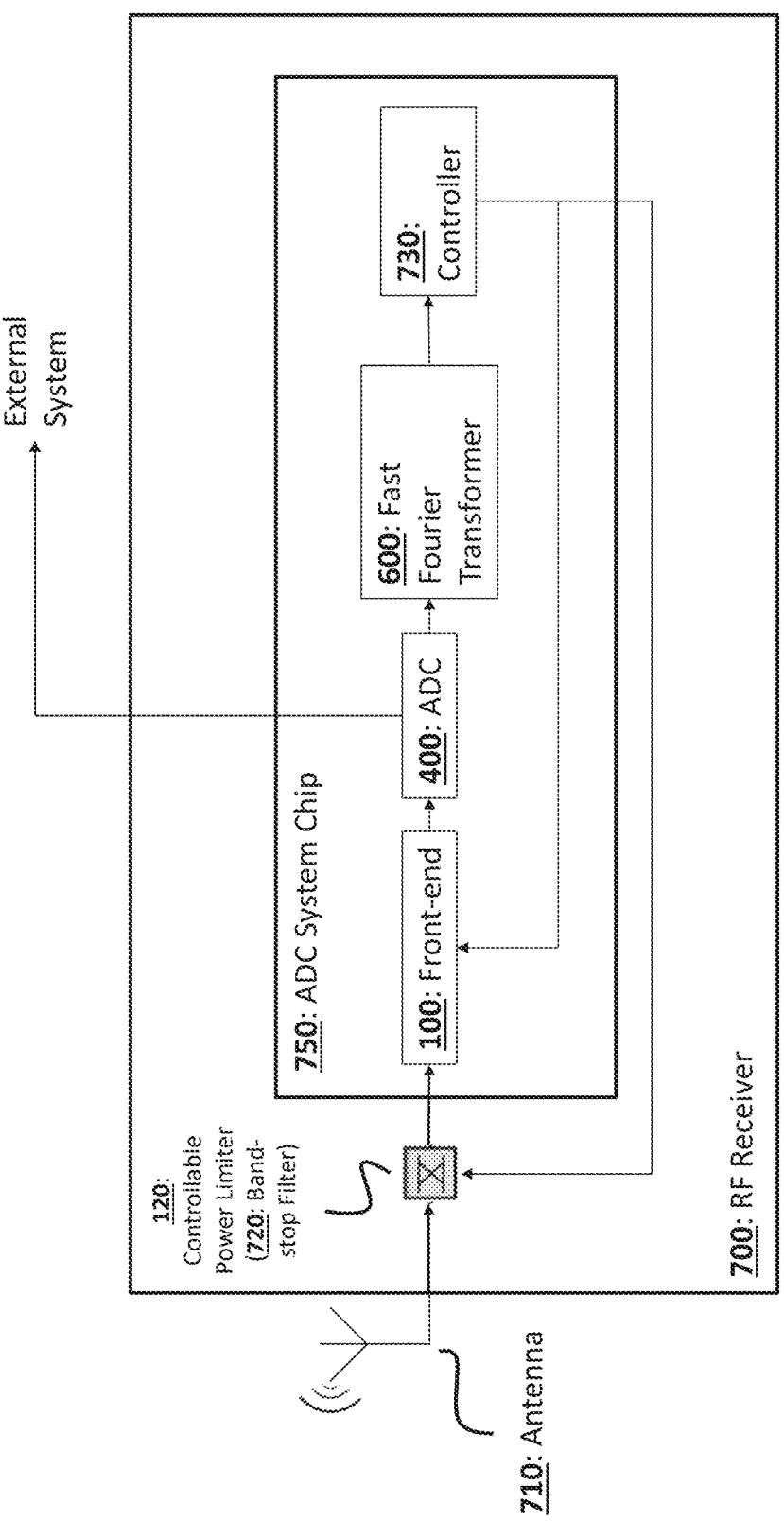
FIG. 8 is a schematic depicting an RF receiver comprising an ADC system, in accordance with embodiments of the present disclosure.

In embodiments of an RF receiver 700 for an RF signal, as depicted in FIG. 8, the receiver comprises an ADC system as described in any of the embodiments set forth above. The receiver may comprise the ADC system chip 750, described above. The receiver may further include a plurality of selectable fixed-frequency band-stop filters or a variable-frequency band-stop filter 720, configured to stop a frequency band identified, in the FFT or spectrum processing described above that is carried out by the fast Fourier transformer 600, to be a blocking frequency that is over-driven so as to risk an adverse impact on the functionality of the RF receiver 700. The plurality of selectable fixed-frequency band-stop filters or variable-frequency band-stop filter 720 may be configured as a portion of the off-chip controllable power limiter 120 depicted in FIG. 2, or may be disposed otherwise to attenuate at least one frequency band, identified as a blocking frequency, prior to inputting into the front-end 100. The plurality of selectable fixed-frequency band-stop filters or variable-frequency band-stop filter 720 may be controlled by a controller 730 based on, for example, identification, by the spectrum processing or FFT, of the frequency band that is of the highest power. After attenuation of the selected frequency band in the RF frequency input, the tuning 25 of the front-end 100 may be repeated as described above, to thereby achieve a greater dynamic range for the ADC system. In embodiments, the identification and stopping of the highest-power remaining frequency band, as described above, may be repeated so as to attenuate the next most powerful frequency band.

The foregoing description of the embodiments of the present disclosure has been presented for the purposes of illustration and description. It is not intended to be exhaustive nor to limit the present disclosure to the precise form disclosed. Many modifications and variations are possible in light of this disclosure. It is intended that the scope of the present disclosure be limited not by this detailed description, but rather by the claims appended hereto. A number of implementations have been described. Nevertheless, it will be understood that various modifications may be made without departing from the scope of the disclosure.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

The reference numerals used in this disclosure are as follows:

100: Programmable On-chip RF Front-end Signal Conditioning System (Front-end)
120: Off-Chip Controllable Power Limiter (CPL)
130: Electrostatic Protection Diodes
140: Input Impedance Matcher
200: Programmable Attenuator
210: Attenuation Control Signal
220: Attenuator Cell
300: Programmable Amplifier
310: Amplification Control Signal
400: Monobit Analog-Digital Converter
410: Fixed-gain Amplifier Block
420: Sampler
430: Electrostatic Protection Diodes
440: Output Impedance Matcher
450: Demultiplexer (Demux)
460: Driver
470: Buffers (Latches)
480: Output Drivers
510: Power of Signal and of Noise of the Analog Input
520: Power of Signal and of Noise after Attenuation
530: Power of Signal and of Noise after Amplification
600: Fast Fourier Transformer
700: RF Receiver
710: Antenna
720: Band-stop Filter
730: Controller
750: ADC System Chip

What is claimed is:

1. An analog-digital converter system comprising:
a front-end signal conditioning system comprising an attenuator configured to attenuate an analog signal and an amplifier in operative communication with the attenuator, the amplifier configured to amplify the analog signal after attenuation by the attenuator; and a monobit analog-digital converter in operative communication with the amplifier, the monobit analog-digital converter configured to convert the analog signal to a monobit signal, wherein the attenuation of the attenuator and the amplification of the amplifier are set so as to reduce the signal-to-noise ratio into the negative SNR domain, and so that the signal levels of the analog signal will be within the dynamic range of the monobit analog-digital converter; and wherein the attenuator comprises a plurality of cascade-connected attenuator cells.

2. The analog-digital converter system of claim 1, wherein attenuation of the attenuator is programmable.

3. The analog-digital converter system of claim 1, wherein the attenuator is configured to be programmable by bypassing individual attenuator cells in response to an attenuation control signal.

4. The analog-digital converter system of claim 1, wherein gain of the amplifier is programmable.

5. The analog-digital converter system of claim 1, wherein the monobit analog-digital converter comprises:

an interleaved sampler configured for interleaved sampling of the output of the monobit analog-digital converter to produce a plurality of data streams; and a demultiplexer configured to further separate the plurality of data streams into a greater plurality of data streams.

6. The analog-digital converter system of claim 1, further comprising a fast Fourier transformer in operative communication with the monobit analog-digital converter, wherein the fast Fourier transformer is configured to perform fast Fourier transformation on an output of the monobit analog-digital converter.

7. An analog-digital converting method, comprising:

attenuating an input signal using an attenuator;

using an amplifier to amplify the output signal from the attenuator;

tuning the attenuator, wherein tuning of the attenuator is achieved by bypassing an attenuator cell in an attenuator that comprises a plurality of attenuator cells; and using a monobit analog-digital convertor to perform monobit analog-digital conversion, wherein the attenuation of the attenuator and the amplification of the amplifier are set so as to reduce the signal-to-noise ratio into the negative SNR domain, and so that the signal levels of the analog signal will be within the dynamic range of the monobit analog-digital converter.

8. The method of claim 7, further comprising tuning the amplifier.

9. The method of claim 7, further comprising sampling a plurality of monobit analog-digital convertor outputs and demultiplexing the sampled results.

10. The method of claim 7, further comprising performing digital post-processing on an output of the monobit analog-digital convertor.

11. The method of claim 10, wherein the digital post-processing on an output of the monobit analog-digital convertor is performance of a fast Fourier transform.

12. The method of claim 10, wherein a result of the digital post-processing is used to adjust the attenuation of the attenuator and/or adjust the amplification of the amplifier.

13. The method of claim 10, wherein a result of the digital post-processing is used to adjust attenuation of a band-stop filter that is configured to attenuate a frequency band of the input signal.

14. A receiver comprising:

an analog-digital converter system that comprises: a front-end signal conditioning system comprising an attenuator configured to attenuate an analog signal and an amplifier in operative communication with the attenuator, the amplifier configured to amplify the analog signal after attenuation by the attenuator; and a monobit analog-digital converter in operative communication with the amplifier, the monobit analog-digital converter configured to convert the analog signal to a monobit signal;

post-processing circuitry configured to perform digital post-processing on said monobit signal; and a band-stop filter to attenuate one or more blocking frequency identified through said digital post-processing wherein the attenuation of the attenuator and the amplification of the amplifier are set so as to reduce the signal-to-noise ratio into the negative SNR domain, and so that the signal levels of the analog signal will be within the dynamic range of the monobit analog-digital converter.

15. The receiver of claim 14, wherein the attenuation of the attenuator is programmable.

\* \* \* \* \*